(12) United States Patent
Zhao et al.

(10) Patent No.: US 11,855,616 B2
(45) Date of Patent: Dec. 26, 2023

(54) INTEGRATED CIRCUIT, CONTROL METHOD, AND SYSTEM

(71) Applicant: HUAWEI TECHNOLOGIES CO., LTD., Shenzhen (CN)

(72) Inventors: Pengfei Zhao, Shenzhen (CN); Lijuan Tan, Shenzhen (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 0 days.

(21) Appl. No.: 17/887,176

(22) Filed: Aug. 12, 2022

(65) Prior Publication Data
US 2022/0393677 A1 Dec. 8, 2022

Related U.S. Application Data

(63) Continuation of application No. PCT/CN2020/075421, filed on Feb. 14, 2020.

(51) Int. Cl.
*H03K 17/56* (2006.01)

(52) U.S. Cl.
CPC ................................. *H03K 17/56* (2013.01)

(58) Field of Classification Search
CPC .... G06F 1/3203; H02J 9/005; H03K 19/0008; H03K 19/0013; H03K 19/0016
USPC .................................................. 327/544–546
See application file for complete search history.

(56) References Cited

U.S. PATENT DOCUMENTS

| 10,637,462 | B1 * | 4/2020 | Pulipati | ............ | H03K 19/01759 |
| 2005/0225353 | A1 * | 10/2005 | Kwon | ................ | H04L 25/0278 |
| | | | | | 326/30 |
| 2006/0109034 | A1 | 5/2006 | Okitsu | | |
| 2009/0177818 | A1 | 7/2009 | Shim et al. | | |
| 2011/0109371 | A1 * | 5/2011 | Kastl | ..................... | G06F 1/3203 |
| | | | | | 710/316 |
| 2011/0316581 | A1 | 12/2011 | Ichikawa | | |
| 2016/0204782 | A1 | 7/2016 | Lee et al. | | |
| 2017/0285729 | A1 * | 10/2017 | Yang | ....................... | H04L 69/22 |
| 2018/0060261 | A1 * | 3/2018 | Chhor | ................ | G06F 13/4282 |
| 2018/0174643 | A1 * | 6/2018 | Cheng | .................... | G11C 5/147 |
| 2021/0367599 | A1 * | 11/2021 | Sung | ................ | H03K 19/09421 |

FOREIGN PATENT DOCUMENTS

| CN | 103545784 A | 1/2014 |
| CN | 106685023 A | 5/2017 |
| CN | 106787031 A | 5/2017 |
| CN | 206251066 U | 6/2017 |

* cited by examiner

*Primary Examiner* — Quan Tra
(74) *Attorney, Agent, or Firm* — Leydig, Voit & Mayer, Ltd.

(57) ABSTRACT

An integrated circuit, a control method, and a system are provided, to improve reliability of the integrated circuit. The integrated circuit mainly includes a power supply pin, a configuration pin, a switchable pull-up resistor, and a control unit. The integrated circuit can provide a control signal for a target chip using the configuration pin of the integrated circuit. In the integrated circuit, a first end of the switchable pull-up resistor is connected to the power supply pin, a second end of the switchable pull-up resistor is connected to the configuration pin, and a control end of the switchable pull-up resistor is connected to the control unit. The power supply pin can receive a power supply voltage of the integrated circuit.

13 Claims, 5 Drawing Sheets

INTEGRATED CIRCUIT, CONTROL METHOD, AND SYSTEM

CROSS-REFERENCE TO RELATED APPLICATIONS

This application is a continuation of International Application No. PCT/CN2020/075421, filed on Feb. 14, 2020, the disclosure of which is hereby incorporated by reference in its entirety.

TECHNICAL FIELD

This application relates to the field of integrated circuit technologies, and in particular, to an integrated circuit, a control method, and a system.

BACKGROUND

Currently, an integrated circuit is usually disposed in an electronic device. For example, a system on chip (SoC) is an integrated circuit configured to achieve a dedicated objective. Most core components of the electronic device may be integrated into the SoC, and an operating state of another chip in the electronic device can be controlled by the SoC.

For example, after being powered on, the SoC may control, using a power supply control pin, a target chip to be powered on. After controlling the target chip to be powered on, the SoC may further configure a parameter of the target chip using a configuration pin. Currently, to adapt to the target chip, a corresponding pull-up resistor usually needs to be disposed for each configuration pin in a peripheral circuit of the SoC. One end of the pull-up resistor is connected to the corresponding configuration pin, and the other end is connected to a pull-up power supply.

However, a pull-up power supply of a pull-up resistor and a power supply of a SoC are usually a same power supply in a current electronic device. In other words, after the SoC is powered on, the pull-up power supply of the pull-up resistor starts discharging. Consequently, a configuration pin is pulled up, a target chip receives a signal from the configuration pin of the SoC before the target chip is powered on, and the target chip operates abnormally.

Therefore, current reliability of the SoC chip needs to be further improved.

SUMMARY

Embodiments of this application provide an integrated circuit, a control method, and a system, to improve reliability of the integrated circuit.

According to a first aspect, an embodiment of this application provides an integrated circuit, and the integrated circuit mainly includes a power supply pin, a configuration pin, a switchable pull-up resistor, and a control unit. The integrated circuit provided in this embodiment of this application can provide a control signal for a target chip by using the configuration pin of the integrated circuit. In the integrated circuit, a first end of the switchable pull-up resistor is connected to the power supply pin, a second end of the switchable pull-up resistor is connected to the configuration pin, and a control end of the switchable pull-up resistor is connected to the control unit. The power supply pin can receive a power supply voltage of the integrated circuit. The control unit can control the switchable pull-up resistor to be in an off state before the target chip is powered on.

In the integrated circuit provided in this embodiment of this application, the switchable pull-up resistor is a controllable switchable resistor. The control unit controls the switchable pull-up resistor to be in the off state before the target chip is powered on, so that a pull-up voltage (the power supply voltage of the integrated circuit) received by the switchable pull-up resistor is not transmitted to the configuration pin, and is neither transmitted to the target chip. Therefore, this embodiment of this application helps prevent the target chip from receiving an error signal from the configuration pin of the integrated circuit before the target chip is powered on. In this way, reliability of the integrated circuit is improved. In addition, because the switchable pull-up resistor is inside the integrated circuit, the power supply voltage of the integrated circuit is used to provide the pull-up voltage for the switchable pull-up resistor. This embodiment helps simplify a structure of a peripheral circuit of the integrated circuit, and reduce a board area occupied by the peripheral circuit and production costs.

For example, that the control unit can control the switchable pull-up resistor to be in an off state before the target chip is powered on specifically may be that the control unit controls the switchable pull-up resistor to be in the off state before a target time point, where the target time point is not earlier than a time point at which the power-on voltage of the target chip reaches a target voltage. It may be understood that, in a power-on process of the target chip, the power-on voltage provided for the target chip may gradually increase from a low initial voltage to the target voltage. In this embodiment of this application, before the target time point, the control unit controls the switchable pull-up resistor to be in the off state. In other words, the control unit controls the switchable pull-up resistor to be in the off state before the power-on voltage of the target chip reaches the target voltage. This helps prevent the target chip from receiving the error signal from the configuration pin of the integrated circuit in the power-on process. Therefore, this technical solution helps further improve reliability of the integrated circuit.

In this embodiment of this application, the integrated circuit may further include a power supply control pin. The control unit may further output a power-on signal by using the power supply control pin, where the power-on signal is used to connect a path for powering on the target chip. In this case, the integrated circuit may further calculate the target time point based on a time point of outputting the power-on signal and a delay for the power-on voltage of the target chip to reach the target voltage.

In this embodiment of this application, the integrated circuit can output the control signal to the target chip by using the configuration pin. For example, the integrated circuit further includes a switchable pull-down resistor, a first end of the switchable pull-down resistor is connected to the configuration pin, a second end of the switchable pull-down resistor is grounded, and a control end of the switchable pull-down resistor is connected to the control unit. In this case, after the target chip is powered on, the control unit may further control the switchable pull-up resistor to be in an on state or the off state, and control the switchable pull-down resistor to be in an on state or an off state, to generate the control signal; and output the control signal to the target chip by using the configuration pin.

To increase a quantity of types of target chips to which the integrated circuit is applicable, the integrated circuit provided in this embodiment of this application may include a plurality of switchable pull-up resistors connected in parallel. When generating the control signal, the control unit may determine one or more target switchable pull-up resistors in the plurality of switchable pull-up resistors; and control the one or more target switchable pull-up resistors to be in an on state or an off state. When one target switchable pull-up resistor is determined, the target switchable pull-up resistor can adjust a high-level voltage of the control signal. When the plurality of target switchable pull-up resistors are determined, parallel resistors of the plurality of target switchable pull-up resistors can adjust the high-level voltage of the control signal. In this embodiment, the one or more target switchable pull-up resistors determined by the control unit are adjusted, so that the integrated circuit is applicable to different types of target chips.

For example, in the integrated circuit provided in this embodiment of this application, the switchable pull-down resistor may include a pull-down switch and a pull-down resistor. The pull-down switch includes the first end, a second end, and the control end. The first end of the pull-down switch is connected to the configuration pin, the second end of the pull-down switch is connected to one end of the pull-down resistor, the control end of the pull-down switch is connected to the control unit, and the other end of the pull-down resistor is grounded. The control end of the pull-down switch is the control end of the switchable pull-down resistor. The control unit can turn on the pull-down switch, to control the switchable pull-down resistor to be in the on state. The control unit can also turn off the pull-down switch, to control the switchable pull-down resistor to be in the off state.

For example, in the integrated circuit provided in this embodiment of this application, the switchable pull-up resistor may include a pull-up switch and a pull-up resistor. The pull-up switch includes the first end, a second end, and the control end. The first end of the pull-up switch is connected to the configuration pin, the second end of the pull-up switch is connected to one end of the pull-up resistor, the control end of the pull-up switch is connected to the control unit, and the other end of the pull-up resistor is connected to the power supply pin. The control end of the pull-up switch is the control end of the switchable pull-up resistor. The control unit can turn on the pull-up switch, to control the switchable pull-up resistor to be in the on state. The control unit can also turn off the pull-up switch, to control the switchable pull-up resistor to be in the off state.

In this embodiment of this application, a resistance value of the switchable pull-up resistor is adapted to the target chip. For example, the resistance value of the switchable pull-up resistor may include any resistance value from 4.7 kΩ to 10 kΩ

According to a second aspect, an embodiment of this application provides a control method. The method may be applied to an integrated circuit. For technical effects of a corresponding solution in the second aspect, refer to technical effects that can be obtained by using a corresponding solution in the first aspect. Repeated descriptions are not provided herein again. For example, the integrated circuit applicable to this embodiment of this application may include a switchable pull-up resistor, a power supply pin, and a configuration pin. A first end of the switchable pull-up resistor is connected to the power supply pin, and a second end of the switchable pull-up resistor is connected to the configuration pin. The integrated circuit can provide a control signal for a target chip by using the configuration pin. In the method provided in this embodiment of this application, the integrated circuit may receive a power supply voltage by using the power supply pin. The integrated circuit controls the switchable pull-up resistor to be in an off state before the target chip is powered on.

To further improve reliability of the integrated circuit, in an embodiment, the integrated circuit may determine, based on a target time point, whether to continue to control the switchable pull-up resistor to be in the off state. The target time point is not earlier than a time point at which a power-on voltage of the target chip reaches a target voltage. For example, the integrated circuit may control the switchable pull-up resistor to be in the off state before the target time point.

In this embodiment of this application, the integrated circuit may further output a power-on signal by using a power supply control pin, where the power-on signal is used to connect a path for powering on the target chip; and calculate the target time point based on a time point of outputting the power-on signal and a delay for the power-on voltage of the target chip to reach the target voltage.

In this embodiment of this application, the integrated circuit may further include a switchable pull-down resistor. A first end of the switchable pull-down resistor is connected to the configuration pin, and a second end of the switchable pull-down resistor is grounded. In this case, after the target chip is powered on, the integrated circuit may further control the switchable pull-up resistor to be in an on state or the off state, and control the switchable pull-down resistor to be in an on state or an off state, to generate the control signal; and output the control signal to the target chip by using the configuration pin.

To increase a quantity of types of target chips to which the integrated circuit is applicable, the integrated circuit provided in this embodiment of this application may include a plurality of switchable pull-up resistors connected in parallel. In this case, when generating the control signal, the integrated circuit may determine one or more target switchable pull-up resistors in the plurality of switchable pull-up resistors. The integrated circuit may further control the one or more target switchable pull-up resistors to be in an on state or an off state.

In this embodiment of this application, a resistance value of the switchable pull-up resistor is adapted to the target chip. For example, the resistance value of the switchable pull-up resistor includes any resistance value from 4.7 kΩ to 10 kΩ.

According to a third aspect, an embodiment of this application provides a system. The system may be an electronic device. For technical effects of a corresponding solution in the third aspect, refer to the technical effects that may be obtained according to a corresponding solution in the first aspect. Repeated descriptions are not provided herein again. For example, the system provided in this embodiment of this application may include the target chip and the integrated circuit provided in the first aspect.

These aspects or other aspects of this application are clearer and more comprehensible in descriptions of the following embodiments.

DESCRIPTION OF EMBODIMENTS

Figure 1:
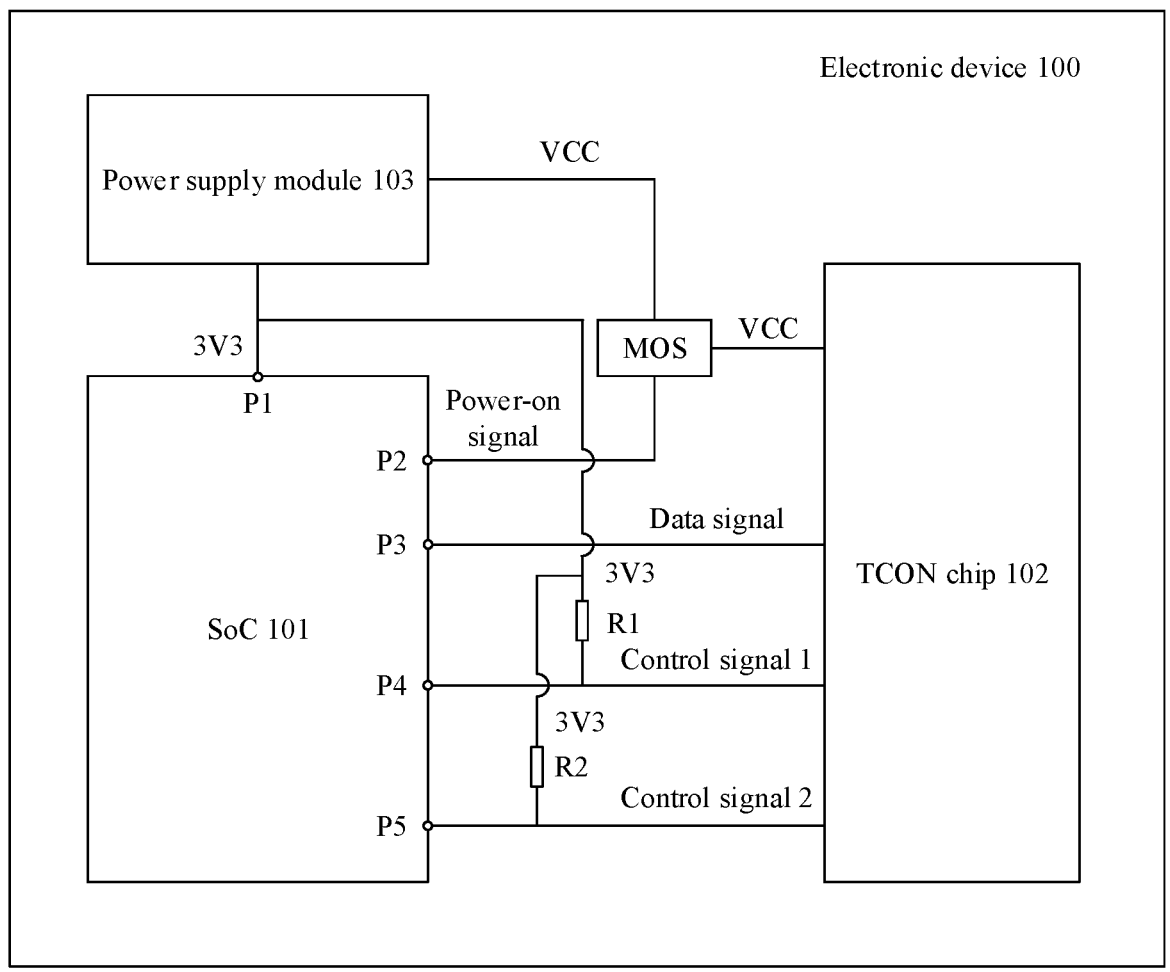
FIG. 1 is a schematic diagram of a structure of an electronic device.

To make objectives, technical solutions, and advantages of this application more clearly, the following further describes this application in detail with reference to the accompanying drawings. It should be noted that in descriptions of embodiments of this application, "at least one" refers to one or more, and "a plurality of refers to two or more. In view of this, in embodiments of the present invention, "a plurality of" may also be understood as "at least two". The term "and/or" describes an association relationship for describing associated objects and represents that three relationships may exist. For example, A and/or B may represent the following three cases: Only A exists, both A and B exist, and only B exists. In addition, the character "/" generally indicates an "or" relationship between the associated objects. In addition, it should be understood that in descriptions of this application, terms such as "first" and "second" are merely used for distinguishing and descriptions, but should not be understood as indicating or implying relative importance, or should not be understood as indicating or implying a sequence.

It should be noted that, in embodiments of this application, a "connection" is an electrical connection, and a connection between two electrical elements may be a direct or indirect connection between the two electrical elements. For example, a connection between A and B may represent that A and B are directly connected to each other, or A and B are indirectly connected to each other by using one or more other electrical elements. For example, the connection between A and B may also represent that A is directly connected to C, C is directly connected to B, and A and B are connected to each other through C.

An integrated circuit (IC) is a micro electronic device or component, and may be understood as a circuit that has a specific function and that uses a semiconductor technology to integrate a specific quantity of commonly-used electronic components, such as a resistor, a capacitor, and a transistor, and connection lines between these components. For example, chips such as a SoC and a central processing unit ( ) may be implemented by using the integrated circuit.

The SoC is used as an example. The SoC may also be referred to as a system on chip or a system chip. The SoC is an integrated circuit to achieve a dedicated objective. Most core components of an electronic device may be integrated into the SoC, to form a micro system.

It may be understood that an entire electronic system of the electronic device usually cannot be integrated into the SoC. Therefore, in addition to the SoC, there may be another functional chip with a specific function in the electronic device. For example, in addition to a SoC, a screen driver chip is further disposed in a smart television, and the screen driver chip may also be referred to as a timing control (TCON) chip. The TCON chip is a processing chip, in the smart television, that receives an image signal and converts the image signal into a time sequence signal for controlling a liquid crystal display.

For another example, in addition to a SoC, a baseband chip is further disposed in a smart terminal. The baseband chip is a chip, in the smart terminal, that is used to synthesize a baseband signal to be transmitted outside or decode a received baseband signal. Types of functional chips may also vary with types of electronic devices, and are not provided one by one in embodiments of this application.

As a core of the electronic device, the SoC may control operation of another functional chip. The following uses the TCON chip as an example for description. FIG. 1 is an example of a schematic diagram of a structure of an electronic device. As shown in FIG. 1, an electronic device 100 mainly includes a SoC 101, a TCON chip 102, and a power supply module 103.

As shown in FIG. 1, the SoC 101 may include a power supply pin P1, a power supply control pin P2, a data pin P3, a configuration pin P4, and a configuration pin P5. The power supply pin P1 is connected to the power supply module 103, the power supply control pin P2 is connected to a power supply switch MOS, and the data pin P3, the configuration pin P4, and the configuration pin 135 are separately connected to corresponding pins in the TCON chip 102.

The power supply switch MOS is disposed on a SoC board in which the SoC is located. The power supply switch MOS mainly includes a control end, a first end, and a second end. The control end of the power supply switch MOS is connected to the power supply control pin P2 of the SoC, the first end of the power supply switch MOS is connected to the power supply module 103, and the second end of the power supply switch MOS is connected to the TCON chip.

The power supply module 103 may include a battery, a power management unit (power management unit, PMU), a direct-current conversion circuit (direct-current conversion circuit), and the like. The power supply module 103 is connected to the SoC 101 and the first end of the power supply switch MOS. The power supply module 103 can provide a power supply voltage to the SoC 101. Generally, the power supply voltage provided by the power supply module 103 to the SoC may be a 3V3 voltage. In other words, the power supply voltage is 3.3 V. Certainly, the voltage may also be another voltage. For example, the power supply voltage may also be a 1.8 V voltage. The SoC 101 may receive the power supply voltage by using the power supply pin P1, to complete power-on.

After the SoC 101 is powered on, an operation such as initialization may be completed. Then, the SoC 101 may continue to control the TCON chip to be powered on. Specifically, the SoC 101 may send a power-on signal to the power supply switch MOS by using the power supply control pin P2. The power-on signal may be used to turn on the power supply switch MOS and connect a path between the power supply module 103 and the TCON chip 102. The power supply module 103 outputs a power-on voltage VCC to the power supply switch MOS, and the power-on voltage VCC is transmitted to the TCON chip by using the power supply switch MOS. The TCON chip receives the power-on voltage VCC to complete power-on.

After the TCON chip is powered on, the SoC 101 may continue to send a control signal 1 to the TCON chip by using the configuration pin P4, and send a control signal 2 to the TCON chip by using the configuration pin P5, to control the TCON chip by using the control signal 1 and the control signal 2.

For example, the SoC 101 may configure the TCON chip by using the control signal 1 and the control signal 2, for example, configure parameters such as a display area and a quantity of bits of the TCON chip. Specifically, the control signal 1 may be a high-level signal corresponding to a digit 1, or may be a low-level signal corresponding to a digit 0. The same applies to the control signal 2. Therefore, four configuration types may be preset in the TCON chip: 00, 01, 10, and 11. The SoC 101 may indicate a specific configuration type of the TOCN chip by using the control signal 1 and the control signal 2. The specific configuration type is any one of the four configuration types, so that the TCON chip 102 can complete configuration based on the specific configuration type indicated by the SoC 101.

After the TCON chip 102 completes configuration, the SoC 101 may transmit a data signal Data to the TCON chip 102 by using the data pin P3, so that the TCON chip 102 can control, based on the data signal Data, a display panel to display an image.

Generally, to improve stability of the configuration pin P4 and the configuration pin P5, as shown in FIG. 1, a pull-up resistor R1 corresponding to the configuration pin P4 and a pull-up resistor R2 corresponding to the configuration pin P5 may also be disposed in a peripheral circuit of the SoC 101.

The pull-up resistor R1 is used as an example. One end of the pull-up resistor R1 is connected to the power supply module 103, and the other end is connected to the configuration pin P4. The pull-up resistor R1 may receive a pull-up voltage from the power supply module 103. When the control signal 1 output by the configuration pin P4 is a high-level signal, the pull-up resistor R1 may divide the received pull-up voltage, to suppress a voltage of the control signal 1 and protect the TCON chip 102.

Generally, a resistance value of the pull-up resistor R1 is set based on the TCON chip 102, so that when the control signal 1 is a high-level signal, the voltage of the control signal 1 can be identified by the TCON chip 102, and the TCON chip 102 is not damaged due to an excessively large current.

As shown in FIG. 1, the pull-up voltage of the pull-up resistor R1 and the power supply voltage of the SoC 101 have a same source. Therefore, when the SoC 101 is powered on, the pull-up resistor R1 also receives the pull-up voltage, and the pull-up resistor R1 may provide a high-level signal for the TCON chip 102. However, the SoC 101 usually does not immediately turn on the power supply switch MOS after being powered on. For example, the SoC 101 needs to first complete initialization, and then turn on the power supply switch MOS. Therefore, when receiving the high-level signal provided by the pull-up resistor R1, the TCON chip 102 is not powered on yet. After receiving the high-level signal provided by the pull-up resistor R1, the TCON chip 102 may make false determining.

In view of this, an embodiment of this application provides an integrated circuit. The integrated circuit may be a SoC, or may be an integrated circuit having a control function, such as a CPU or a microcontroller unit (microcontroller unit, MCU). This is not limited in this embodiment of this application. For ease of description, the SoC is still used as an example for description in the following embodiments of this application.

Figure 2:
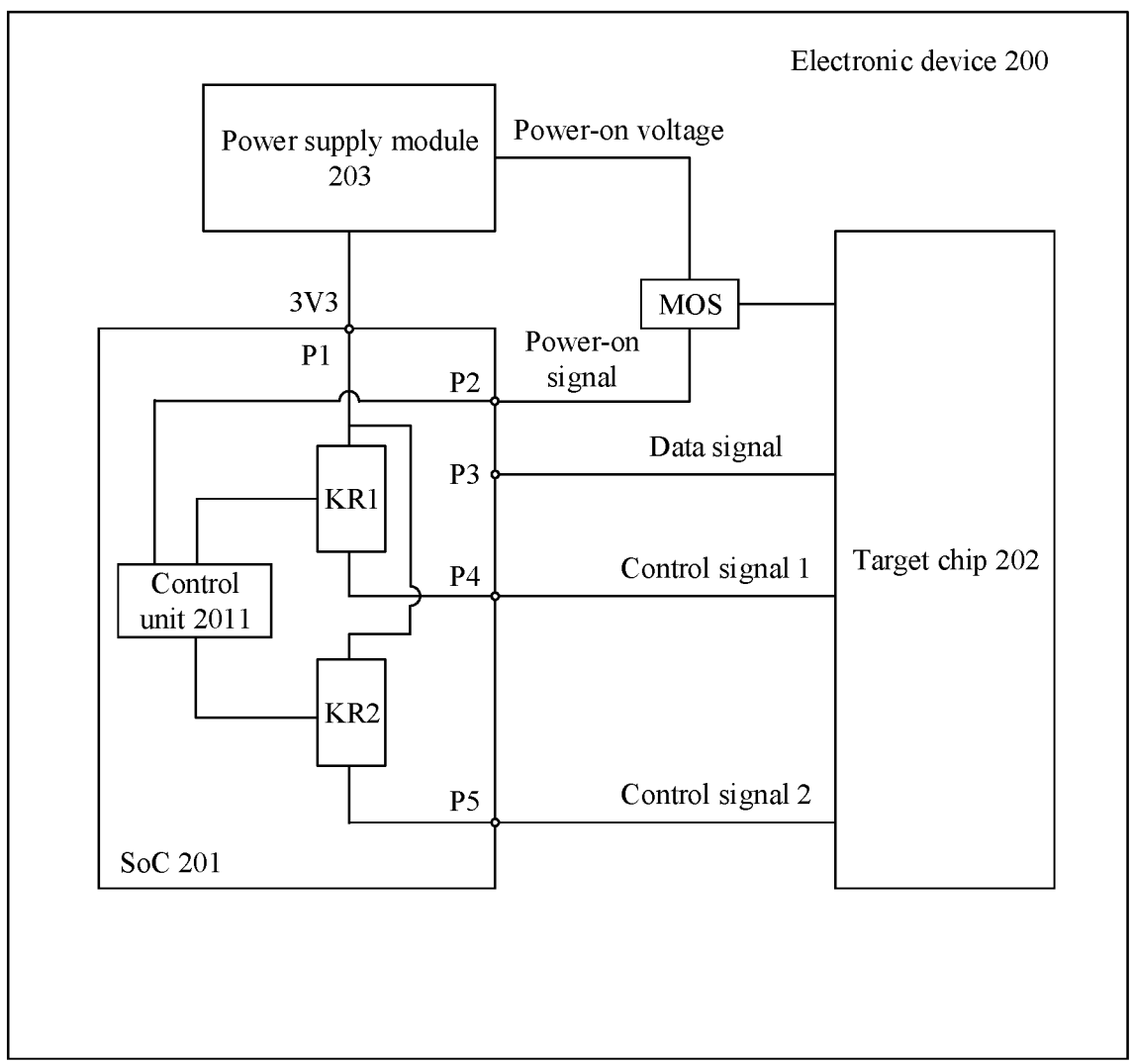
FIG. 2 is a schematic diagram of a system structure of an electronic device according to an embodiment of this application.

FIG. 2 is an example of a schematic diagram of a system structure of an electronic device to which an embodiment of this application is applicable. As shown in FIG. 2, an electronic device 200 includes a SoC 201 and a target chip 202. The target chip 202 may be a functional chip controlled by the SoC 201, for example, a baseband chip, a TCON chip, a sensor chip, or another functional chip that is located in a power supply domain different from that of the SoC 201.

In an embodiment, the electronic device 200 may further include a power supply module 203, and the power supply module 203 may supply power to the SoC 201 and the target chip 202. For an embodiment of the power supply module 203, refer to the power supply module 103. Details are not described herein again.

As shown in FIG. 2, the SoC 201 mainly includes a power supply pin P1, configuration pins P4 and P5, switchable pull-up resistors (KR1 and KR2), and a control unit 2011. It should be understood that the SoC 201 may include one or more configuration pins, and each configuration pin corresponds to a switchable pull-up resistor. As shown in FIG. 2, the configuration pin P4 corresponds to the switchable pull-up resistor KR1, and the configuration pin 135 corresponds to the switchable pull-up resistor KR2. The SoC 201 can provide a control signal for the target chip by using the configuration pins P4 and 135.

As shown in FIG. 2, the switchable pull-up resistor KR1 includes a first end, a second end, and a control end. The first end of the switchable pull-up resistor KR1 is connected to the power supply pin P1. Therefore, after the SoC 201 receives a power supply voltage by using the power supply pin P1, the power supply voltage may also be used as a pull-up voltage of the switchable pull-up resistor KR1.

The second end of the switchable pull-up resistor KR1 is connected to the configuration pin P4, and the control end of the switchable pull-up resistor KR1 is connected to the control unit 2011. The control unit 2011 may control the switchable pull-up resistor KR1 to be in an off state before the target chip 202 is powered on.

It should be understood that a quantity of configuration pins does not affect specific implementations of this embodiment of this application. For example, the SoC 201 may include only one configuration pin, for example, include only the configuration pin P4; or the SoC 201 may include a plurality of configuration pins, for example, include the configuration pins P4 and 135. When the SoC 201 includes the plurality of configuration pins, the plurality of configuration pins also correspond to switchable pull-up resistors, and a connection manner between each configuration pin and a corresponding switchable pull-up resistor is similar to that between the configuration pin P4 and the switchable pull-up resistor KR1.

For example, in FIG. 2, the configuration pin 135 corresponds to the switchable pull-up resistor KR2. The switchable pull-up resistor KR2 includes a first end, a second end, and a control end. The first end of the switchable pull-up resistor KR2 is connected to the power supply pin P1. Therefore, after the SoC 201 receives the power supply voltage by using the power supply pin P1, the power supply voltage may also be used as a pull-up voltage of the switchable pull-up resistor KR2. The second end of the switchable pull-up resistor KR2 is connected to the configuration pin 135, and to the control end of the switchable pull-up resistor KR2 is connected to the control unit 2011. The control unit 2011 may control the switchable pull-up resistor KR2 to be in an off state before the target chip 202 is powered on.

In the following, unless otherwise specified, the configuration pin P4 and the switchable pull-up resistor KR1 are used as examples for description. Another configuration pin (for example, P5) and another switchable pull-up resistor (for example, KR2) in the SoC 201 may have a similar implementation, and details are not described herein again.

In this embodiment of this application, the switchable pull-up resistor KR1 is a controllable switchable resistor. The control unit 2011 keeps the switchable pull-up resistor KR1 off before the target chip 202 is powered on, so that the pull-up voltage (the power supply voltage of the SoC 201) received by the switchable pull-up resistor KR1 is not transmitted to the configuration pin P4, and is neither transmitted to the target chip 202. Therefore, this embodiment of this application helps prevent the target chip 202 from receiving an error signal from the configuration pin P4 before the target chip 202 is powered on. In this way, reliability of the SoC 201 is improved.

In addition, in this embodiment of this application, because the switchable pull-up resistor KR1 is inside the SoC 201, the power supply voltage of the SoC is used to provide the pull-up voltage for the switchable pull-up resistor KR1. This embodiment helps simplify a structure of a peripheral circuit of the SoC, and reduce a board area occupied by the peripheral circuit and production costs.

After the target chip 202 is powered on, the SoC 201 may send a control signal 1 by using the configuration pin P4. In this embodiment of this application, a specific implementation of the control signal 1 is mainly determined based on a type of the target chip 202. For example, the control signal 1 may be a high-level signal or a low-level signal, to indicate a configuration type to the target chip 202, for example, the foregoing configuration of the TCON chip 102. For another example, the control signal 1 may also carry configuration information of the target chip 202, for example, a value of each parameter that needs to be configured by the target chip 202; and the target chip 202 may complete configuration based on the configuration information.

Figure 3:
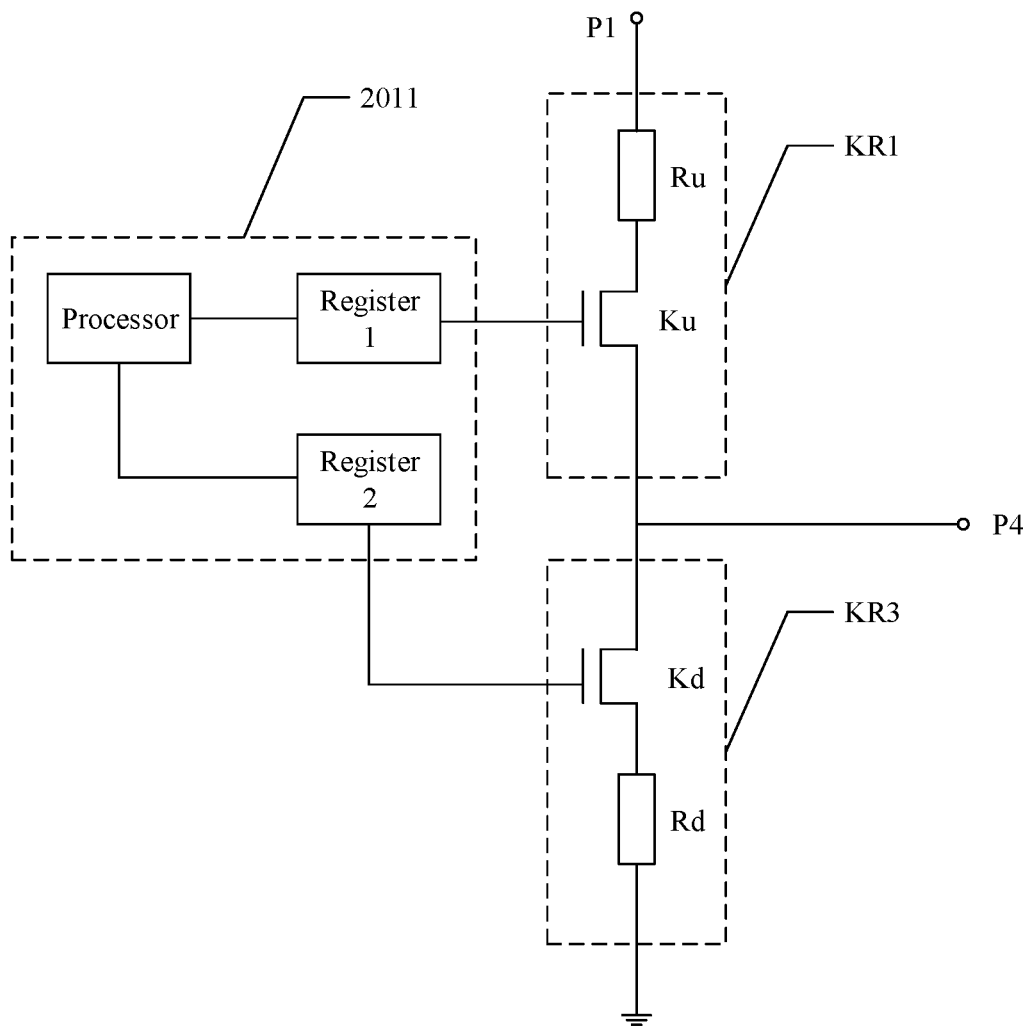
FIG. 3 is an enlarged schematic diagram of a partial structure in an integrated circuit according to an embodiment of this application.

For example, as shown in FIG. 3, the SoC 201 may further include a switchable pull-down resistor KR3 corresponding to the configuration pin P4. The switchable pull-down resistor KR3 includes a first end, a second end, and a control end. The first end of the switchable pull-down resistor KR3 is connected to the configuration pin P4, and the second end of the switchable pull-down resistor KR3 is grounded. After the target chip 202 is powered on, the control unit 2011 may control the switchable pull-up resistor KR1 to be in an on state or the off state, and control the switchable pull-down resistor KR3 to be in an on state or an off state, to generate the control signal 1. Then, the control signal 1 is output to the target chip by using the configuration pin P4.

To be specific, when the switchable pull-up resistor KR1 is in the on state, and the switchable pull-down resistor KR3 is in the off state, the control signal 1 is at a high level. When the switchable pull-up resistor KR1 is in the off state, and the switchable pull-down resistor KR3 is in the on state, the control signal 1 is at a low level. Therefore, the control unit 2011 may control the switchable pull-up resistor KR1 to be in the on state or the off state and control the switchable pull-down resistor KR3 to be in the on state or the off state, to generate the control signal 1.

The following further describes the switchable pull-up resistor KR1, the switchable pull-down resistor KR3, and the control unit 2011 by using examples.

Switchable Pull-Up Resistor KR1

In this embodiment of this application, a resistance value of the switchable pull-up resistor KR1 may be adapted to the target chip. In this way, when the control signal 1 is at the high level, the control signal 1 can be identified by the target chip 202, and the target chip 202 is not damaged due to an excessively large current. Generally, the resistance value of the switchable pull-up resistor may include any resistance value from 4.7 kΩ to 10 kΩ.

As shown in FIG. 3, the switchable pull-up resistor KR1 includes a pull-up switch Ku and a pull-up resistor Ru. The pull-up switch Ku includes the first end, a second end, and the control end. The first end of the pull-up switch Ku is connected to the configuration pin P4, the second end of the pull-up switch Ku is connected to one end of the pull-up resistor Ru, the control end of the pull-up switch Ku is connected to the control unit 2011, and the other end of the pull-up resistor Ru is connected to the power supply pin P1.

The control end of the pull-up switch Ku is the control end of the switchable pull-up resistor KR1. The control unit 2011 may turn on the pull-up switch Ku, to control the switchable pull-up resistor KR1 to be in the on state. The control unit 2011 may also turn off the pull-up switch Ku, to control the switchable pull-up resistor KR1 to be in the off state.

In this case, a resistance value of the pull-up resistor Ru is the resistance value of the switchable pull-up resistor KR1. In other words, the resistance value of the pull-up resistor Ru may be adapted to the target chip 202. Generally, the resistance value of the pull-up resistor Ru may include any resistance value from 4.7 kΩ to 10 kΩ.

Switchable Pull-Down Resistor KR3

As shown in FIG. 3, the switchable pull-down resistor KR3 may include a pull-down switch Kd and a pull-down resistor Rd. The pull-down switch Kd includes the first end, a second end, and the control end. The first end of the pull-down switch Kd is connected to the configuration pin P4, the second end of the pull-down switch Kd is connected to one end of the pull-down resistor Rd, the control end of the pull-down switch Kd is connected to the control unit 2011, and the other end of the pull-down resistor Rd is grounded.

The control end of the pull-down switch Kd is the control end of the switchable pull-down resistor KR3. The control unit 2011 may turn on the pull-down switch Kd, to control the switchable pull-down resistor KR3 to be in the on state. The control unit 2011 may also turn off the pull-down switch Kd, to control the switchable pull-down resistor KR3 to be in the off state.

Generally, the pull-down resistor Rd has a large resistance value. This can reduce a magnitude of a current that passes through the switchable pull-down resistor KR3 when the pull-down switch Kd is turned on, and helps protect the pull-down switch Kd.

Control Unit 2011

In this embodiment of this application, the control unit 2011 may control the switchable pull-up resistor KR1 to be in the off state before the target chip 202 is powered on. It should be understood that, before the target chip is powered on, the switchable pull-up resistor KR1 keeps being in the off state.

A functional chip that requires a large operating voltage, for example, the TCON chip, requires a specific power-on delay to complete power-on. Specifically, the control unit 2011 may output a power-on signal by using the power supply control pin P2. The power-on signal may be used to connect a path for powering on the target chip 202. For example, in FIG. 2, the power-on signal may be used to turn on the power supply switch MOS, so that a path between the power supply module 203 and the target chip 202 is connected, and the power-on voltage output by the power supply module 203 can be transmitted to the target chip 202.

Because an operating voltage of the target chip 202 is large, to protect the target chip 202, the power-on voltage gradually increases from a low initial voltage to a target voltage. It may be considered that the target chip 202 completes power-on only after the power-on voltage is stabilized at the target voltage.

In view of this, in an embodiment, the control unit 2011 may control the switchable pull-up resistor KR1 to be in the off state before a target time point. The target time point is not earlier than a time point at which the power-on voltage of the target chip 202 reaches the target voltage, namely, a time point at which the target chip 202 completes power-on.

For example, the control unit 2011 may calculate the target time point based on a time point of outputting the power-on signal and a delay for the power-on voltage of the target chip 202 to reach the target voltage. A delay between a time point at which the target chip 202 starts to be powered on and the time point at which the power-on voltage of the target chip 202 reaches the target voltage is a power-on delay of the target chip 202. The power-on delay may be preset in the SoC 201.

In another embodiment, the control unit 2011 may also start timing after outputting the power-on signal. Before timing duration reaches a first delay, the switchable pull-up resistor KR1 is controlled to be in the off state. A time length of the first delay is not less than that of the power-on delay of the target chip 202.

Next, a structure of the control unit 2011 is further described by using an example. As shown in FIG. 3, the control unit 2011 may include a processor and one or more registers. The processor and the registers may be integrated into a same module, or may be disposed independently. This is not limited in this embodiment of this application.

The one or more registers in the control unit 2011 one-to-one correspond to switchable resistors controlled by the control unit 2011. For example, in FIG. 3, the control unit 2011 includes a register 1 and a register 2. The register 1 corresponds to the switchable pull-up resistor KR1, in other words, the register 1 is connected to the control end of the switchable pull-up resistor KR1. The register 2 corresponds to the switchable pull-down resistor KR3, in other words, the register 2 is connected to the control end of the switchable pull-down resistor KR3.

Figure 4:
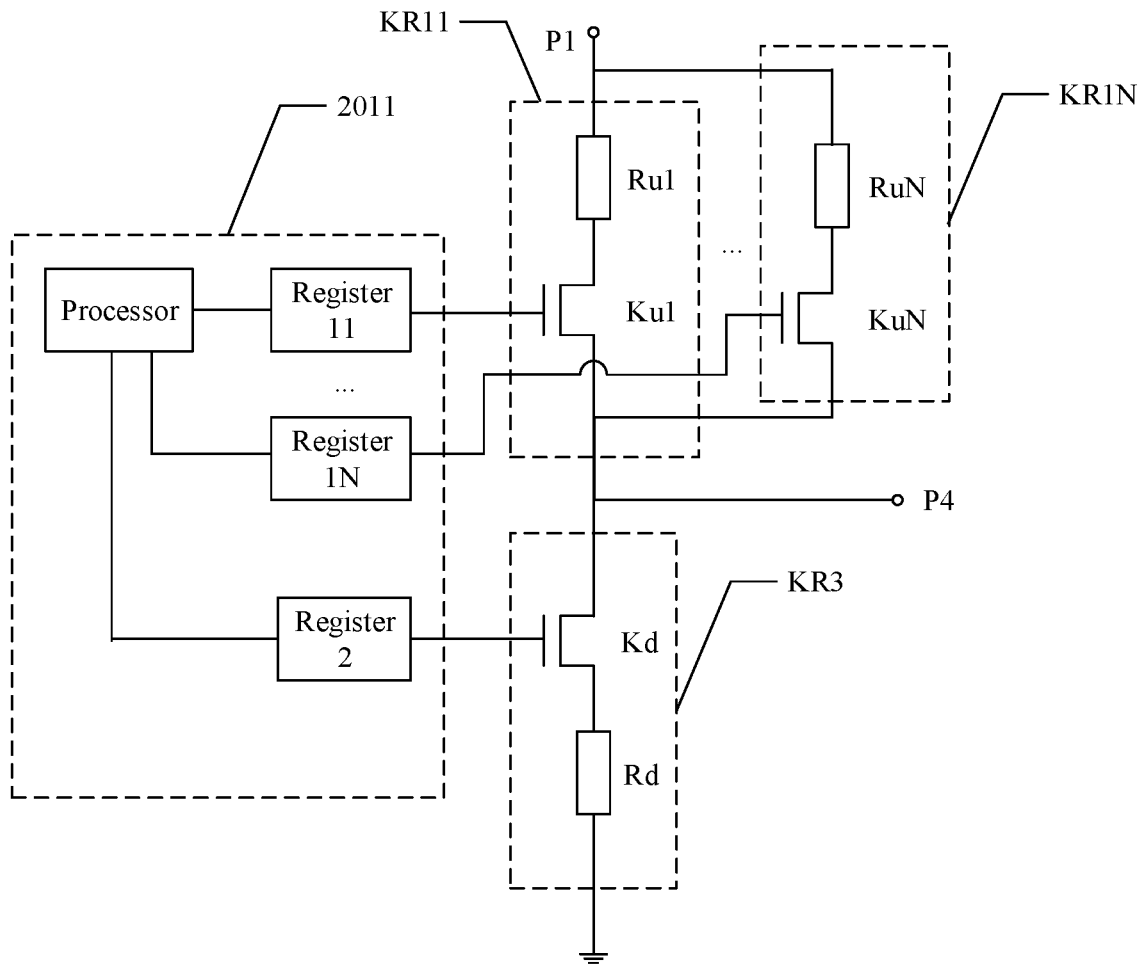
FIG. 4 is an enlarged schematic diagram of another partial structure in an integrated circuit according to an embodiment of this application.

For another example, in FIG. 4, the SoC 201 may include N switchable pull-up resistors (KR11 to KR1N, where N is an integer greater than 1) that correspond to the configuration pin P4. In this case, the control unit 2011 includes registers 11 to 1N and the register 2. The register 11 to the register 1N correspond to the switchable pull-up resistors KR11 to KR1N, and the register 2 corresponds to the switchable pull-down resistor KR3.

The processor and the register 1 in FIG. 3 are used as examples. The processor may write control information of the switchable pull-up resistor KR1 into the register 1. The register 1 then generates a drive signal based on the control information of the switchable pull-up resistor KR1, where the drive signal may control the switchable pull-up resistor KR1 to be on or off A specific example is used for description. When the switchable pull-up resistor KR1 needs to be turned on, the processor may write data 1 into the register 1. The register 1 generates a drive signal a based on the written data 1, and provides the drive signal a for the switchable pull-up resistor KR1, to turn on the switchable pull-up resistor KR1. When the switchable pull-up resistor KR1 needs to be turned off, the processor may write data 0 into the register 1. The register 1 generates a drive signal b based on the written data 0, and provides the drive signal b for the switchable pull-up resistor KR1, to turn off the switchable pull-up resistor KR1.

A manner in which the control unit 2011 controls another switchable resistor is similar to that of the switchable pull-up resistor KR1, and details are not described herein again.

As shown in FIG. 4, the N switchable pull-up resistors in the SoC 201 are connected in parallel between the power supply pin P1 and the configuration pin P4. In this case, when configuring the target chip 202, the control unit 2011 may determine one or more target switchable pull-up resistors in the N switchable pull-up resistors, control the one or more target switchable pull-up resistors to be in an on state or an off state, and control the switchable pull-down resistor KR3 to be in the on state or off state, to generate the control signal 1.

In this embodiment of this application, resistance values of the N switchable pull-up resistors may be set based on a possible type of the target chip 202. Resistance values of different switchable pull-up resistors may be the same or may be different.

Specifically, information about the target switchable pull-up resistors may be set for the SoC 201 based on the target chip 202. When configuring the target chip 202, the control unit 2011 may determine the one or more target switchable pull-up resistors in the N switchable pull-up resistors based on the information about the target switchable pull-up resistors.

When one target switchable pull-up resistor is determined, the target switchable pull-up resistor can adjust a high-level voltage of the control signal 1. When the plurality of target switchable pull-up resistors are determined, parallel resistors of the plurality of target switchable pull-up resistors can adjust the high-level voltage of the control signal 1.

It may be understood that, when the target chip 202 is configured, in the N switchable pull-up resistors, other switchable pull-up resistors than the target switchable pull-up resistors are in an off state, to avoid causing interference to the control signal 1.

Based on a same technical idea, an embodiment of this application further provides a control method. The method may be used in an integrated circuit. For example, the integrated circuit may be the integrated circuit (SoC) provided in any one of the foregoing embodiments. Details are not described in this embodiment of this application again.

Figure 5:
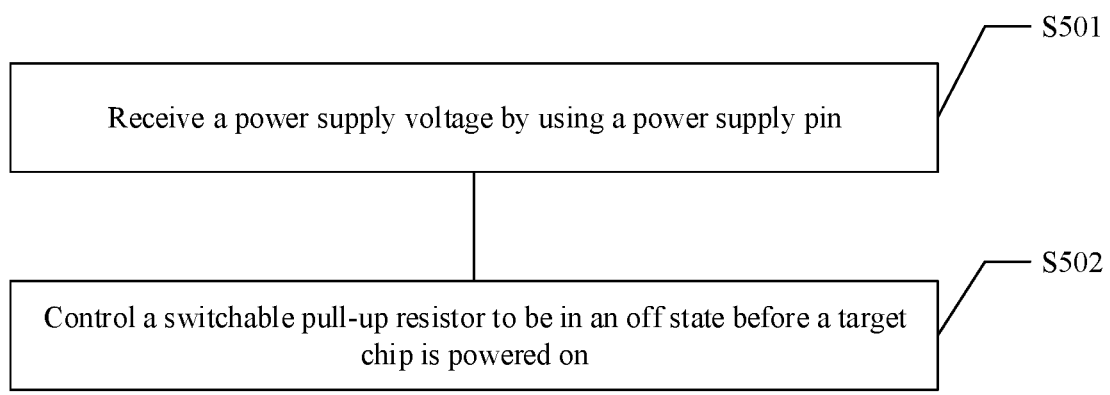
FIG. 5 is a schematic flowchart of a control method according to an embodiment of this application.

FIG. 5 is an example of a schematic flowchart of a control method according to an embodiment of this application. As shown in FIG. 5, the method mainly includes the following steps.

S501: Receive a power supply voltage by using a power supply pin.

S502: Control a switchable pull-up resistor to be in an off state before a target chip is powered on.

In this embodiment of this application, the switchable pull-up resistor is a controllable switchable resistor, and an integrated circuit keeps the switchable pull-up resistor off before the target chip is powered on, so that a pull-up voltage (namely, a power supply voltage of the integrated circuit) received by the switchable pull-up resistor is not transmitted to a configuration pin, and is neither transmitted to the target chip. Therefore, this embodiment of this application helps prevent the target chip from receiving an error signal from the configuration pin before the target chip is powered on. In this way, reliability of the integrated circuit is improved.

In addition, because the switchable pull-up resistor in this application is inside the integrated circuit, the power supply voltage of the integrated circuit is used to provide the pull-up voltage for the switchable pull-up resistor. This implementation helps simplify a structure of a peripheral circuit of the integrated circuit, and reduce a board area occupied by the peripheral circuit and production costs.

To further improve reliability of the integrated circuit, in an embodiment, the integrated circuit may determine, based on a target time point, whether to continue to control the switchable pull-up resistor to be in the off state. The target time point is not earlier than a time point at which a power-on voltage of the target chip reaches a target voltage.

For example, the integrated circuit may control the switchable pull-up resistor to be in the off state before the target time point.

In this embodiment of this application, the integrated circuit may further output a power-on signal by using a power supply control pin, where the power-on signal is used to connect a path for powering on the target chip; and calculate the target time point based on a time point of outputting the power-on signal and a delay for the power-on voltage of the target chip to reach the target voltage.

In this embodiment of this application, the integrated circuit may further include a switchable pull-down resistor. A first end of the switchable pull-down resistor is connected to the configuration pin, and a second end of the switchable pull-down resistor is grounded. In this case, after the target chip is powered on, the integrated circuit may further control the switchable pull-up resistor to be in an on state or the off state, and control the switchable pull-down resistor to be in an on state or an off state, to generate a control signal; and output the control signal to the target chip by using the configuration pin.

To increase a quantity of types of target chips to which the integrated circuit is applicable, the integrated circuit provided in this embodiment of this application may include a plurality of switchable pull-up resistors connected in parallel. In this case, when generating the control signal, the integrated circuit may determine one or more target switchable pull-up resistors in the plurality of switchable pull-up resistors. The integrated circuit may further control the one or more target switchable pull-up resistors to be in an on state or an off state.

Figure 6:
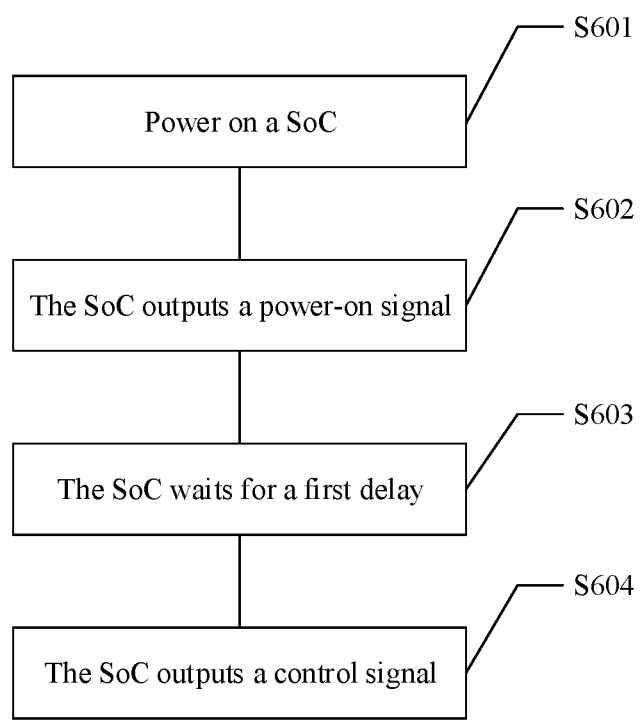
FIG. 6 is a schematic flowchart of a specific control method according to an embodiment of this application.

Next, the SoC 201 shown in FIG. 2 is used as an example for description by using a specific example. FIG. 6 is a schematic flowchart of a control method according to an embodiment of this application. As shown in FIG. 6, the control method mainly includes the following steps.

S601: Power on the SoC 201. Specifically, the SoC 201 may receive, by using the power supply pin P1, the power supply voltage provided by the power supply module 203, to complete power-on. Generally, after being powered on, the SoC 201 may further perform an operation such as initialization. When performing S601, the SoC 201 controls the switchable pull-up resistors KR1 and KR2 to be in the off state.

S602: The SoC 201 outputs the power-on signal. Specifically, the SoC 201 may output the power-on signal to the power supply switch MOS by using the power supply control pin P2. The power-on signal may be used to turn on the power supply switch MOS, so that the path between the power supply module 203 and the target chip 202 is connected, and the power-on voltage output by the power supply module 203 can be transmitted to the target chip 202. When performing S602, the SoC 201 controls the switchable pull-up resistors KR1 and KR2 to be in the off state.

S603: The SoC 201 waits for the first delay. The time length of the first delay is not less than that of the power-on delay of the target chip 202. After the SoC 201 outputs the power-on signal, it may be considered that the target chip 202 starts to be powered on. After the first delay ends, it may be considered that the target chip 202 completes power-on. When performing S603, the SoC 201 controls the switchable pull-up resistors KR1 and KR2 to be in the off state.

S604: The SoC 201 outputs the control signal. In this period, the SoC 201 may control the switchable pull-up resistor KR1 to be in the on state or the off state, to generate the control signal 1. In addition, the SoC 201 may control the switchable pull-up resistor KR2 to be in the on state or the off state, to generate the control signal 2. Therefore, the SoC 201 may control the target chip 202 by using the control signal 1 and the control signal 2.

A person skilled in the art should understand that embodiments of this application may be provided as a method, a system, or a computer program product. Therefore, this application may use a form of hardware only embodiments, software only embodiments, or embodiments with a combination of software and hardware. Moreover, this application may use a form of a computer program product that is implemented on one or more computer-usable storage media (including but not limited to a disk memory, a CD-ROM, an optical memory, and the like) that include computer usable program code.

This application is described with reference to the flowcharts and/or block diagrams of the method, the device (system), and the computer program product according to this application. It should be understood that computer program instructions may be used to implement each process and/or each block in the flowcharts and/or the block diagrams and a combination of a process and/or a block in the flowcharts and/or the block diagrams. These computer program instructions may be provided for a general-purpose computer, a dedicated computer, an embedded processor, or a processor of any other programmable data processing device to generate a machine, so that the instructions executed by a computer or the processor of any other programmable data processing device generate an apparatus for implementing a specific function in one or more processes in the flowcharts and/or in one or more blocks in the block diagrams.

These computer program instructions may be saved in a computer-readable memory that can indicate the computer or any other programmable data processing device to work in a specific manner, so that the instructions saved in the computer-readable memory generate an artifact that includes an instruction apparatus. The instruction apparatus implements a specific function in one or more processes in the flowcharts and/or in one or more blocks in the block diagrams.

These computer program instructions may be loaded onto a computer or another programmable data processing device, so that a series of operations and steps are performed on the computer or the another programmable device, to generate computer-implemented processing. Therefore, the instructions executed on the computer or the another programmable device provide steps for implementing a specific function in one or more processes in the flowcharts and/or in one or more blocks in the block diagrams.

Clearly, a person skilled in the art can make various modifications and variations to this application without departing from the protection scope of this application. This application is intended to cover these modifications and variations of this application provided that they fall within the scope of the claims of this application and their equivalent technologies.

What is claimed is:

1. An integrated circuit, comprising a power supply pin, a configuration pin, a switchable pull-up resistor, and a control unit, wherein the integrated circuit is configured to provide a control signal for a target chip using the configuration pin;

a first end of the switchable pull-up resistor is connected to the power supply pin, a second end of the switchable pull-up resistor is connected to the configuration pin, and a control end of the switchable pull-up resistor is connected to the control unit;

the power supply pin is configured to receive a power supply voltage of the integrated circuit; and the control unit is configured to:

control the switchable pull-up resistor to be in an off state before the target chip is powered on and before a target time point, wherein the target time point is not earlier than a time point at which a power-on voltage of the target chip reaches a target voltage; and calculate the target time point based on a time point of outputting a power-on signal and a delay for the power-on voltage of the target chip to reach the target voltage, wherein the power-on signal is used to connect a path for powering on the target chip.

2. The integrated circuit according to claim 1 wherein the integrated circuit further comprises a power supply control pin; and the control unit is further configured to:

output the power-on signal using the power supply control pin.

3. The integrated circuit according to claim 1, wherein the integrated circuit further comprises a switchable pull-down resistor, a first end of the switchable pull-down resistor is connected to the configuration pin, a second end of the switchable pull-down resistor is grounded, and a control end of the switchable pull-down resistor is connected to the control unit; and the control unit is further configured to:

after the target chip is powered on, control the switchable pull-up resistor to be in an on state or the off state, and control the switchable pull-down resistor to be in an on state or an off state, to generate the control signal; and output the control signal to the target chip using the configuration pin.

4. The integrated circuit according to claim 3, wherein the integrated circuit comprises a plurality of switchable pull-up resistors connected in parallel; and the control unit is configured to:

determine one or more target switchable pull-up resistors in the plurality of switchable pull-up resistors; and control the one or more target switchable pull-up resistors to be in an on state or an off state.

5. The integrated circuit according to claim 3, wherein the switchable pull-down resistor comprises a pull-down switch and a pull-down resistor;

the pull-down switch comprises the first end, a second end, and the control end; and the first end of the pull-down switch is connected to the configuration pin, the second end of the pull-down switch is connected to one end of the pull-down resistor, the control end of the pull-down switch is connected to the control unit, and the other end of the pull-down resistor is grounded.

6. The integrated circuit according to claim 1, wherein the switchable pull-up resistor comprises a pull-up switch and a pull-up resistor;

the pull-up switch comprises the first end, a second end, and the control end; and the first end of the pull-up switch is connected to the configuration pin, the second end of the pull-up switch is connected to one end of the pull-up resistor, the control end of the pull-up switch is connected to the control unit, and the other end of the pull-up resistor is connected to the power supply pin.

7. The integrated circuit according to claim 1, wherein a resistance value of the switchable pull-up resistor is adapted to the target chip.

8. The integrated circuit according to claim 1, wherein the resistance value of the switchable pull-up resistor comprises any resistance value from 4.7 k$\Omega$ to 10 k$\Omega$.

9. A control method, applied to an integrated circuit, wherein the integrated circuit comprises a switchable pull-up resistor, a power supply pin, and a configuration pin, a first end of the switchable pull-up resistor is connected to the power supply pin, a second end of the switchable pull-up resistor is connected to the configuration pin, and the integrated circuit is configured to provide a control signal for a target chip using the configuration pin; and the method comprises:

receiving a power supply voltage using the power supply pin; and controlling the switchable pull-up resistor to be in an off state before the target chip is powered on and before a target time point, wherein the target time point is not earlier than a time point at which a power-on voltage of the target chip reaches a target voltage; and calculating the target time point based on a time point of outputting a power-on signal and a delay for the power-on voltage of the target chip to reach the target voltage, wherein the power-on signal is used to connect a path for powering on the target chip.

10. The control method according to claim 9, wherein after the receiving a power supply voltage using the power supply pin, the method further comprises:

outputting a power-on signal by using a power supply control pin of the integrated circuit.

11. The control method according to claim 9, wherein the integrated circuit further comprises a switchable pull-down resistor, a first end of the switchable pull-down resistor is connected to the configuration pin, and a second end of the switchable pull-down resistor is grounded; and the method further comprises:

after the target chip is powered on, controlling the switchable pull-up resistor to be in an on state or the off state, and controlling the switchable pull-down resistor to be in an on state or an off state, to generate the control signal; and outputting the control signal to the target chip using the configuration pin.

12. The control method according to claim 11, wherein the integrated circuit comprises a plurality of switchable pull-up resistors connected in parallel; and the controlling the switchable pull-up resistor to be in an on state or the off state comprises:

determining one or more target switchable pull-up resistors in the plurality of switchable pull-up resistors; and controlling the one or more target switchable pull-up resistors to be in an on state or an off state.

13. The control method according to claim 9, wherein a resistance value of the switchable pull-up resistor is adapted to the target chip.

* * * * *